(12) United States Patent
Lian et al.

(10) Patent No.: US 11,083,091 B2
(45) Date of Patent: Aug. 3, 2021

(54) HOLE CONNECTING LAYER MANUFACTURING METHOD, CIRCUIT BOARD MANUFACTURING METHOD AND CIRCUIT BOARD

(71) Applicants: GUANGZHOU FASTPRINT CIRCUIT TECH CO., LTD., Guangzhou (CN); SHENZHEN FASTPRINT CIRCUIT TECH CO., LTD., Shenzhen (CN); YIXING SILICON VALLEY ELECTRONICS TECH CO., LTD., Yixing (CN)

(72) Inventors: Zeyang Lian, Guangzhou (CN); Sen Wu, Guangzhou (CN); Yanguo Li, Guangzhou (CN); Bei Chen, Guangzhou (CN)

(73) Assignees: GUANGZHOU FASTPRINT CIRCUIT TECH CO., LTD., Guangdong (CN); SHENZHEN FASTPRINT CIRCUIT TECH CO., LTD., Guangdong (CN); YIXING SILICON VALLEY ELECTRONICS TECH CO., LTD., Jiangsu (CN)

( * ) Notice: Subject to any disclaimer, the term of this patent is extended or adjusted under 35 U.S.C. 154(b) by 0 days.

(21) Appl. No.: 16/642,186

(22) PCT Filed: Dec. 29, 2017

(86) PCT No.: PCT/CN2017/120094
§ 371 (c)(1),
(2) Date: Feb. 26, 2020

(87) PCT Pub. No.: WO2018/233272
PCT Pub. Date: Dec. 27, 2018

(65) Prior Publication Data
US 2020/0315031 A1 Oct. 1, 2020

(30) Foreign Application Priority Data

Jun. 20, 2017 (CN) .......................... 201710470463.8

(51) Int. Cl.
*H05K 3/42* (2006.01)
*H05K 1/11* (2006.01)
(Continued)

(52) U.S. Cl.
CPC ............. *H05K 3/429* (2013.01); *H05K 1/115* (2013.01); *H05K 3/027* (2013.01); *H05K 3/4611* (2013.01); *H05K 3/0047* (2013.01)

(58) Field of Classification Search
CPC ........ H05K 1/115; H05K 3/027; H05K 3/429; H05K 3/4611; H05K 3/0047; H05K 3/42
(Continued)

(56) References Cited

U.S. PATENT DOCUMENTS 9,265,146 B2    2/2016   Hsu et al.
2012/0325533 A1 12/2012  Yoshimura
(Continued)

FOREIGN PATENT DOCUMENTS

CN    101640983 A    2/2010
CN    101848606 A    9/2010
(Continued)

OTHER PUBLICATIONS

International Preliminary Report on Patentability for International Application No. PCT/CN2017/120094 dated Dec. 24, 2019.
(Continued)

*Primary Examiner* — Tremesha S Willis
(74) *Attorney, Agent, or Firm* — Dorsey & Whitney LLP (57) ABSTRACT

Disclosed are a hole connecting layer manufacturing method, a circuit board manufacturing method and a circuit board. The hole connecting layer manufacturing method
(Continued)

comprises: adhering a first insulating dielectric layer, used for laminating and filling, to a daughter board; laminating and solidifying the first insulating dielectric layer on the daughter board; adhering a second insulating dielectric layer, used for laminating and filling, to the first insulating dielectric layer which has been laminated and solidified; manufacturing a first receiving hole on the first insulating dielectric layer and a second receiving hole on the second insulating dielectric layer, wherein the first receiving hole and the second receiving hole are provided vertically opposite to each other; filling both the first receiving hole and the second receiving hole with a conductive medium to complete manufacturing of the hole connecting layer.

8 Claims, 6 Drawing Sheets

(51) Int. Cl.
*H05K 3/02* (2006.01)
*H05K 3/46* (2006.01)
*H05K 3/00* (2006.01)

(58) Field of Classification Search
USPC .......................................................... 174/262
See application file for complete search history.

(56) References Cited

U.S. PATENT DOCUMENTS

| 2013/0126221 A1 | 5/2013 | Kanda |
| 2014/0124250 A1 | 5/2014 | Iwasaki et al. |
| 2015/0029679 A1 | 1/2015 | Iida et al. |

FOREIGN PATENT DOCUMENTS

| CN | 102843876 A | 12/2012 |
| CN | 103348778 A | 10/2013 |
| CN | 203313514 U | 11/2013 |
| CN | 103517583 A | 1/2014 |
| CN | 105636368 A | 6/2016 |
| CN | 107257603 A | 10/2017 |
| WO | 2011029291 A1 | 3/2011 |

OTHER PUBLICATIONS

International Search Report and Written Opinion for International Application No. PCT/CN2017/120094 dated Apr. 8, 2018.

HOLE CONNECTING LAYER MANUFACTURING METHOD, CIRCUIT BOARD MANUFACTURING METHOD AND CIRCUIT BOARD

TECHNICAL FIELD

The present disclosure relates to the technical field of printed circuit boards, in particular to a method of manufacturing a hole connecting layer, a method of manufacturing a circuit board and a circuit board.

BACKGROUND

With the development and construction of the communication industry, the multilayer backplane has been gradually applied. And with the increase of all kinds of networked consumer products in the future, the requirement of higher capacity and higher speed will be put forward for information transmission. The construction of 5G network in the future will necessarily be supported by backplanes which may carry more sub-boards, has less signal loss and be more reliable. It will be a development direction of the printed circuit industry in the future to realize the manufacturing technology of the backplane with ultra-high density and more layers.

Via bond (hole connecting) process is a kind of arbitrary interconnection technology between layers in Z direction. The pre-manufactured sub-boards are bonded and pressed together through an intermediate receiving layer to realize multilayers, and an interconnection is electrically connected by a conductive medium. The advantage of this technology is that the manufacturing method is simple and the manufacture of an ultra-multilayer circuit board can be realized.

However, there are still drawbacks to the traditional via bond process: in the process of manufacturing POFV (plated on filled via), the copper thickness and uniformity of the outer layer of the sub-board are difficult to control, and the average value is generally controlled in the range of 30 μm to 40 μm, range ±5 μm. Therefore, the fluidity of the prepreg between sub-boards should meet the requirement of filling glue on both sides. Meanwhile, in order to prevent the conductive medium from being squeezed and scattered, the prepreg of the intermediate receiving layer generally needs to use a low fluidity. Therefore, the traditional via bond technology is in contradiction with the requirement for the fluidity of the prepreg, so how to ensure that the conductive medium may not be squeezed and scattered while meeting the requirement of filling glue is an urgent problem to be solved.

SUMMARY

In view of the above, in order to overcome the defects of the prior art, the present disclosure provides a method of manufacturing a hole connecting layer, a method of manufacturing a circuit board and a circuit board, which not only can meet the requirement of filling glue on both sides and improve the adhesive strength of two adjacent sub-boards, but also can control the fluidity of the hole connecting layer, prevent the hole shape of the receiving hole from being damaged due to too much flowing glue, and ensure that the conductive medium is not squeezed and scattered.

Its technical solution is as follows:

A method of manufacturing a hole connecting layer is provided. The hole connecting layer is arranged between two adjacent sub-boards in at least two sub-boards stacked in sequence from top to bottom. The method of manufacturing the hole connecting layer includes the following steps of: attaching a first insulating dielectric layer for pressing and filling glue to a side of one of the sub-boards facing adjacent another sub-board; pressing and curing the first insulating dielectric layer located on the sub-board; attaching a second insulating dielectric layer for pressing and filling glue on the first insulating dielectric layer after pressing and curing, wherein a side of the second insulating dielectric layer away from the first insulating dielectric layer is used to be bonded to the adjacent another sub-board; manufacturing a first receiving hole in the first insulating dielectric layer, and manufacturing a second receiving hole in the second insulating dielectric layer, wherein the first receiving hole and the second receiving hole are arranged oppositely up and down; and filling a conductive medium in the first receiving hole and the second receiving hole to complete the manufacture of the hole connecting layer, wherein each sub-board is electrically connected to the adjacent another sub-board through the conductive medium.

In the method of manufacturing the hole connecting layer according to the embodiment of the present disclosure, the first insulating dielectric layer is attached to one of the sub-boards, and the filling glue requirement of the sub-board is met through the first insulating dielectric layer. Then, the first insulating dielectric layer is pressed and cured, and the second insulating dielectric layer is attached to the first insulating dielectric layer after pressing and curing. The second insulating dielectric layer is used to press and fill glue to another sub-board. In summary, in the embodiment of the present disclosure, one of the sub-boards is filled with glue through the first insulating dielectric layer, and the second sub-board is filled with glue through the second insulating dielectric lay, thereby ensuring a sufficient amount of glue during pressing. Even if the thickness range of copper on the sub-board is large, it can meet the requirement of filling glue and improve the bonding strength between two adjacent sub-boards. At the same time, in the process of pressing the sub-boards to form a mother board, the first insulating dielectric layer has been pressed and cured, and will not be hot-melted and softened during the subsequent pressed process, and basically will not flow. Therefore, the fluidity of the hole connecting layer according to the embodiment of the present disclosure is basically derived from a single second insulating dielectric layer, and the hole connecting layer can be controlled to have a small fluidity. In summary; the method of manufacture the hole connecting layer according to the present disclosure fully meets the requirement of filling glue on both sides, and improves the bonding strength between adjacent sub-boards. In addition, the hole connecting layer may also be controlled to have a small fluidity to prevent the hole shape of the receiving hole from being damaged due to too much flowing glue, and ensure that the conductive medium is not squeezed and scattered.

The following is a further explanation of the above technical solution:

In one of the embodiments, an aperture of the first receiving hole is less than or equal to an aperture of a conductive via hole of two adjacent sub-boards; and an aperture of the second receiving hole is less than or equal to the aperture of the conductive via hole of two adjacent sub-boards. By providing the first receiving hole and the second receiving hole with a smaller aperture, the impedance in a signal transmission process is reduced, and the fluctuation and loss of the signal during transmission are reduced.

In one of the embodiments, the conductive medium is a conductive resin including a metal alloy containing particles of a metal such as copper, tin, bismuth, or the like. During the heating of lamination, the particles of metal tin and bismuth are melted by heat to weld together the metal copper particles and the pads on the sub-board, so as to realize the conduction and fixed connection of two upper and lower adjacent sub-boards.

In one of the embodiments, the first insulating dielectric layer is a thermosetting first prepreg, so as to ensure that the first insulating dielectric layer is not heated and melted again due to the lamination of the sub-board after the lamination is cured, and then achieve the effect of controlling the fluidity of the hole connecting layer.

In one of the embodiments, in the step of attaching the second insulating dielectric layer on the first insulating dielectric layer, the second insulating dielectric layer includes a second prepreg and a protective layer located on the second prepreg. And after the step of manufacturing the first receiving hole in the first insulating dielectric layer, and manufacturing the second receiving hole in the second insulating dielectric layer, the step of removing the protective film is further included. The protective film is provided to prevent the insulating dielectric layer from being damaged during the subsequent manufacture of the receiving hole.

In one of the embodiments, a flow distance of the hole connecting layer is 25 mil to 200 mil, which can ensure that the conductive medium is not squeezed and scattered, and ensure the safety and reliability of the circuit board.

The technical solution further provides a method of manufacturing a circuit board, which includes the following steps of: manufacturing sub-boards, wherein the number of the sub-boards is at least two, and the at least two sub-boards are arranged in sequence from top to bottom, wherein one side of each of the manufactured sub-boards facing the adjacent another sub-board is provided with a pad layer, and the pad layer is provided with a pad in one-to-one correspondence and conduction with a conductive via hole on the sub-board; in two adjacent sub-boards, manufacturing a hole connecting layer by using the method of manufacturing the hole connecting layer; and laminating all of the sub-boards to form a mother hoard.

In the embodiment of the present disclosure, the pad layer is arranged on the surface of each sub-board to be bonded, and the circuit of each layer on each sub-board extends to the pads on the pad layer through the conductive via hole, and thereafter is electrically connected to the circuit of each layer on another sub-board via the conductive medium on the hole connecting layer. In the process of pressing, the hole connecting layer bonds two upper and lower adjacent sub-boards. Since upper and lower sides of the hole connecting layer are in contact with the pad layer of the sub-board, the pad layer only has pads (without circuits), and the rests of the pad layer are copper-free areas, so as to reduce the residual copper rate, and then reduce the difficulty of filling glue and further ensure the sufficiency of filling glue on both sides, strengthen the bonding strength between the sub-boards, and avoid the delamination phenomenon due to insufficient glue filling, which caused by the bonding between the sub-board circuit layer and the insulating dielectric layer directly. In addition, the present disclosure also effectively avoid that the pad is directly added in the original design circuit layer, so as to avoid the short circuit phenomenon of the circuit board caused by insufficient alignment space between the conductive medium on one sub-board and the pad on another sub-board in the contacting process of the sub-boards.

In one of the embodiments, at least two sub-boards are arranged in sequence from top to bottom to form a sub-board group, and the sub-board group includes two end sub-boards at both ends. The step of manufacturing sub-boards includes a step of manufacturing the end sub-boards. The step of manufacturing the end sub-boards includes the following steps of: preparing two pieces of copper foils, a plurality of copper clad boards, and a plurality of third prepregs, upper and lower sides of each of the copper clad boards being provided with circuit layers; stacking a copper foil, a plurality of copper clad boards, and a copper foil in sequence to form a pre-pressing board, wherein at least one of the third prepregs is arranged between two adjacent copper clad boards, and at least one of the third prepregs is also arranged between two pieces of copper foil and the copper clad board; pressing the pre-pressing board to form a pressing board; manufacturing the conductive via hole on the pressing board; and etching a circuit on one of the copper foils to form a surface circuit layer, and etching a pad on the other copper foil to form the pad layer, so as to complete the manufacture of the end sub-board.

As can be known from the above, the number of copper foil layers (including the number of circuit layers and the number of pad layers) on each end sub-board is even, so as to make the lamination structure of the sub-board symmetrical and avoid the occurrence of warpage.

In one of the embodiments, the number of the sub-boards is at least three. The sub-board group further includes an intermediate sub-board located between two end sub-boards. The step of manufacturing sub-boards further includes a step of manufacturing the intermediate sub-board, The step of manufacturing the intermediate sub-board includes the following steps of: preparing two pieces of copper foils, a plurality of copper clad boards, and a plurality of third prepregs, upper and lower sides of each of the copper clad boards being provided with circuit layers; stacking a copper foil, a plurality of copper clad boards, and a copper foil in sequence to form a pre-pressing board, wherein at least one of the third prepregs is arranged between two adjacent copper clad boards, and at least one of the third prepregs is also arranged between two pieces of copper foil and the copper clad board; pressing the pre-pressing board to form a pressing board; manufacturing the conductive via hole on the pressing board; and etching a pad on each of two pieces of copper foils to form the pad layer, so as to complete the manufacture of the intermediate sub-board.

As can be known according to the same principle, the number of copper foil layers on each intermediate sub-board is even, so as to make the lamination structure of the sub-board symmetrical and avoid the occurrence of warpage. At the same time, both sides of the intermediate sub-board are provided with the pad layer, so as to reduce the difficulty of filling glue when being in contact with the two sub-boards on upper and lower sides of the intermediate sub-board.

The technical solution further provides a circuit board which includes a hole connecting layer and at least two sub-boards. At least two sub-boards are stacked in sequence from top to bottom, and the hole connecting layer is arranged between two adjacent sub-boards. The hole connecting layer includes a first insulating dielectric layer pre-pressed and pre-cured on one of the sub-boards, and a second insulating dielectric layer arranged on the first insulating dielectric layer. The second insulating dielectric layer is used to be bonded to the adjacent another sub-board in the process of pressing and shaping. The first insulating dielectric layer is provided with a first receiving hole, and the second insulating dielectric layer is provided with a second receiving hole. Both of the first receiving hole and the second receiving hole are provided with a conductive medium. One of two adjacent sub-boards is electrically connected to the other sub-board through the conductive medium.

The circuit board according to the embodiment of the present disclosure includes a new type of hole connecting layer, so that the circuit board not only can meet the requirement of filling glue on both sides and improve the adhesive strength of two adjacent sub-boards, but also control the fluidity of the hole connecting layer, prevent the hole shape of the receiving hole from being damaged due to too much flowing glue, and ensure that the conductive medium is not squeezed and scattered.

DESCRIPTION OF REFERENCE NUMERALS

100: sub-board,
110: copper clad board,
120: third prepreg,
130: conductive via hole,
200: first insulating dielectric layer,
300: second insulating dielectric layer,
400: conductive medium.

DETAILED DESCRIPTION OF THE EMBODIMENTS

In order to make the object, technical solution and advantages of the present disclosure clearer, the present disclosure will be described in further detail with reference to the accompanying drawings and specific embodiments. It should be understood that the embodiments described herein are only used to explain the present disclosure and do not limit the scope of the present disclosure.

Figure 1:
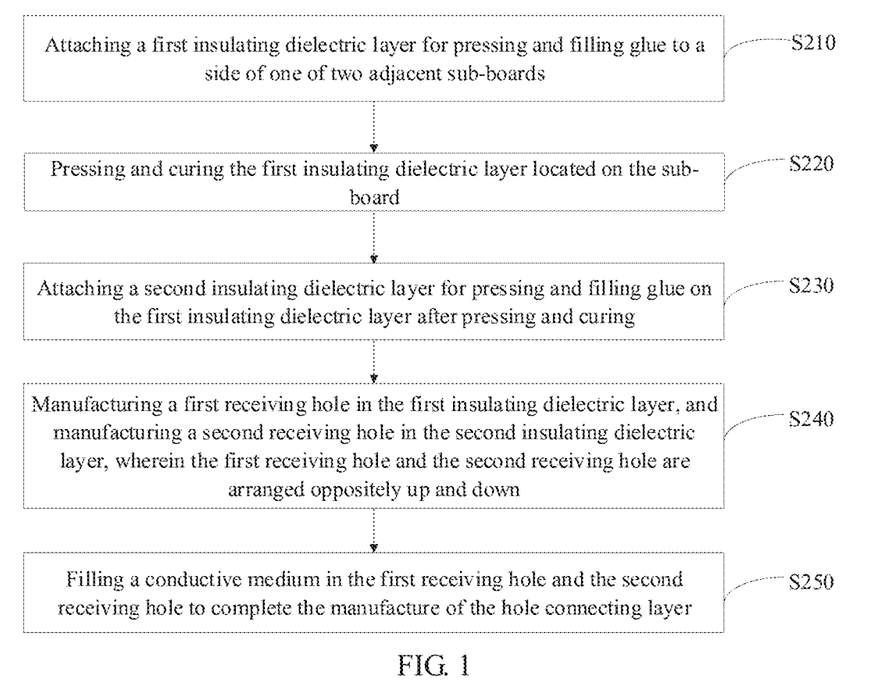
FIG. 1 is a flowchart of a method of manufacturing a hole connecting layer according to an embodiment of the present disclosure.
Figure 6:
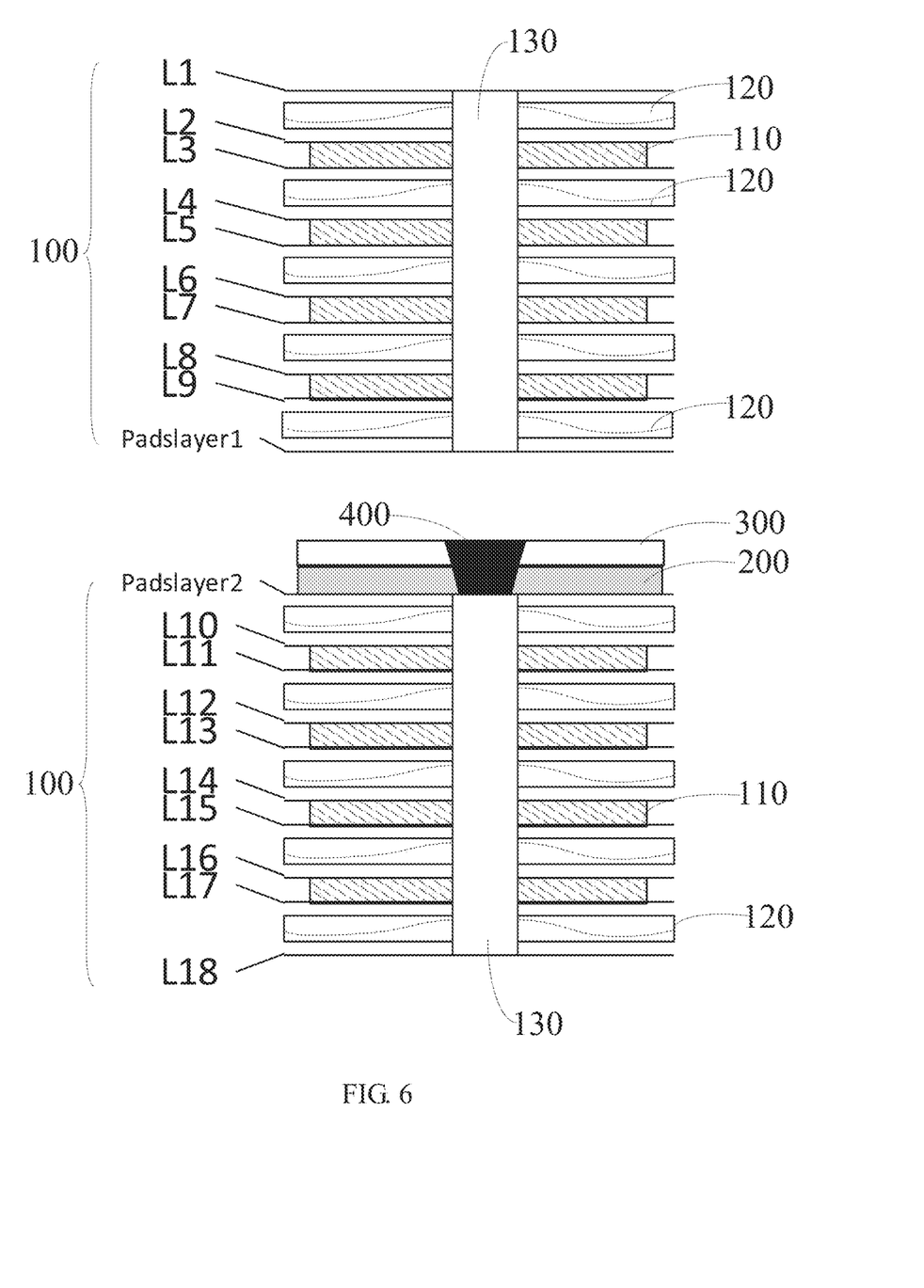
FIG. 6 is an exploded structural diagram of a circuit board according to an embodiment of the present disclosure.

The mother board is generally formed by laminating at least two sub-boards 100 stacked in sequence from top to bottom. A hole connecting layer (via bond layer) is arranged between two adjacent sub-boards 100. As shown in FIG. 1 and FIG. 6, the method of manufacturing the hole connecting layer according to the present disclosure includes the following steps:

In step S210, a first insulating dielectric layer 200 for pressing and filling glue is attached to a side of one of two adjacent sub-boards 100 facing adjacent another sub-board 100.

In step S220, the first insulating dielectric layer 200 located on the sub-board 100 is pressed and cured.

In step S230, a second insulating dielectric layer 300 for pressing and filling glue is attached on the first insulating dielectric layer 200 after pressing and curing. A side of the second insulating dielectric layer 300 away from the first insulating dielectric layer 200 is used to be bonded to the adjacent another sub-board 100.

The second insulating dielectric layer 300 includes a second prepreg and a protective layer located on the second prepreg. The protective film is provided to prevent the insulating dielectric layer from being damaged during the subsequent manufacture of the receiving hole.

In step S240, a first receiving hole is manufactured in the first insulating dielectric layer 200, and a second receiving hole is manufactured in the second insulating dielectric layer 300. The first receiving hole and the second receiving hole are arranged oppositely up and down.

Specifically, after the second receiving hole is drilled in the second insulating dielectric layer 300 in sequence from top to bottom by laser drilling, the first receiving hole is then drilled in the first insulating dielectric layer 200 to ensure the accuracy and speed of drilling. It is advantageous to realize high density group hole machining.

In step S250, a conductive medium 400 is filled in both of the first receiving hole and the second receiving hole, and the protective film is removed, so as to complete the manufacture of the hole connecting layer.

The conductive via hole 130 on each sub-board 100 is electrically connected to the conductive via hole 130 of the adjacent another sub-board 100 through the conductive medium 400.

In the method of manufacturing the hole connecting layer according to the embodiment of the present disclosure, a first insulating dielectric layer 200 is attached to one of the sub-boards 100, and the filling glue requirement of the sub-board 100 is met through the first insulating dielectric layer 200. Then, the first insulating dielectric layer 200 is pressed and cured, and a second insulating dielectric layer 300 is attached to the first insulating dielectric layer 200 after pressing and curing. The second insulating dielectric layer 300 is used to press and fill glue to another sub-board 100. In summary, in the embodiment of the present disclosure, one of the sub-boards 100 is filled with glue through the first insulating dielectric layer 200, and the second sub-board 100 is filled with glue through the second insulating lay 300, thereby ensuring a sufficient amount of glue during pressing. Even if the thickness range of copper on the sub-board 100 is large, it can meet the requirement of filling glue and improve the bonding strength between two adjacent sub-boards 100. At the same time, in the process of pressing the sub-boards 100 to form the mother board, the first insulating dielectric layer 200 has been pressed and cured, and will not be hot-melted and softened during the subsequent pressed process, and basically will not flow. Therefore, the fluidity of the hole connecting layer according to the embodiment of the present disclosure is basically derived from a single second insulating dielectric layer 300, and the hole connecting layer can be controlled to have a small fluidity. In summary, the method of manufacturing the hole connecting layer according to the present disclosure fully meets the requirement of filling glue on both sides, and improves the bonding strength between adjacent sub-boards 100. In addition, the hole connecting layer may also be controlled to have a small fluidity to prevent the hole shape of the receiving hole from being damaged due to too much flowing glue, and ensure that the conductive medium is not squeezed and scattered.

In the embodiment, the first insulating dielectric layer 200 is a thermosetting first prepreg, so as to ensure that the first insulating dielectric layer 200 is not heated and melted again due to the subsequent lamination of the sub-board 100 after the lamination is cured, and then achieve the effect of controlling the fluidity of the hole connecting layer. The flow distance of the hole connecting layer in the present disclosure is controlled to be 25 mil to 200 mil, which can ensure that the conductive medium 400 is not squeezed and scattered, and ensure the safety and reliability of the circuit board.

In addition, the aperture of the first receiving hole is less than or equal to the aperture of the conductive via hole 130 of two adjacent sub-boards 100; and the aperture of the second receiving hole is less than or equal to the aperture of the conductive via hole 130 of two adjacent sub-boards 100. By providing the first receiving hole and the second receiving hole with a smaller aperture, the impedance in a signal transmission process is reduced, and the fluctuation and loss of the signal during transmission are reduced.

Optionally, the conductive medium 400 is a conductive resin having a metal alloy containing particles of a metal such as copper, tin, bismuth, or the like. During the heating of lamination among sub-boards, the particles of metal tin and bismuth are melted by heat to weld together the metal copper particles and the pads on the sub-board 100, so as to realize the conduction and fixed connection of the upper and lower adjacent sub-boards 100.

Figure 2:
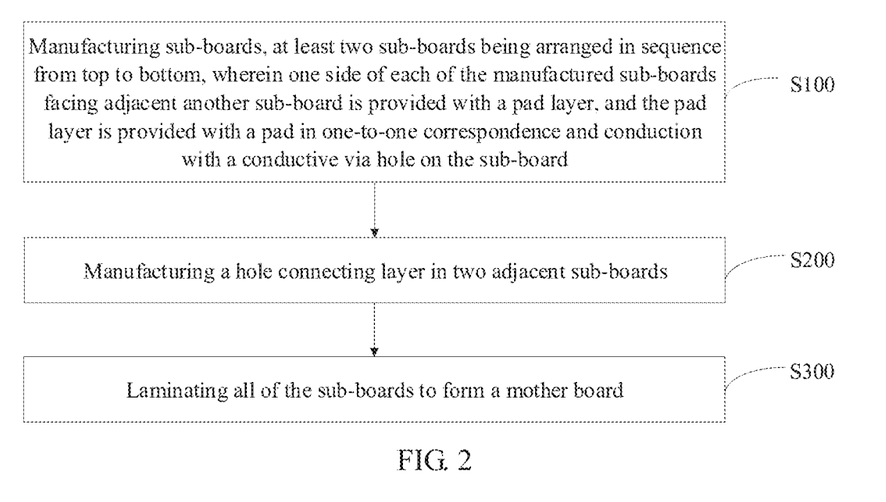
FIG. 2 is a flowchart of a method of manufacturing a circuit board according to an embodiment of the present disclosure.
Figure 3:
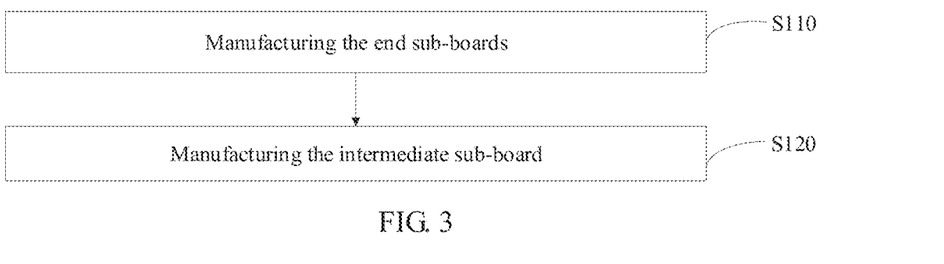
FIG. 3 is a flowchart of manufacturing sub-boards according to an embodiment of the present disclosure.

As shown in FIG. 2, FIGS. 6 to 8, the present disclosure also provides a method of manufacturing a circuit board, which includes the following steps:

In step S100, sub-boards 100 are manufactured. The number of the sub-boards 100 is at least two, and the at least two sub-boards 100 are arranged in sequence from top to bottom. One side of each sub-board 100 facing the adjacent another sub-board 100 is provided with a pad layer (e.g., padslayer1, padslayer2, padslayer3, padslayer4, and padslayer5 shown in FIG. 6 and FIG. 8), and each sub-board 100 is provided with a conductive via hole 130, and the conductive via holes 130 of two adjacent sub-boards 100 are in one-to-one correspondence and opposed up and down. The pad layer is provided with a pad in one-to-one correspondence and conduction with the conductive via hole 130 on the sub-board 100.

Figure 8:
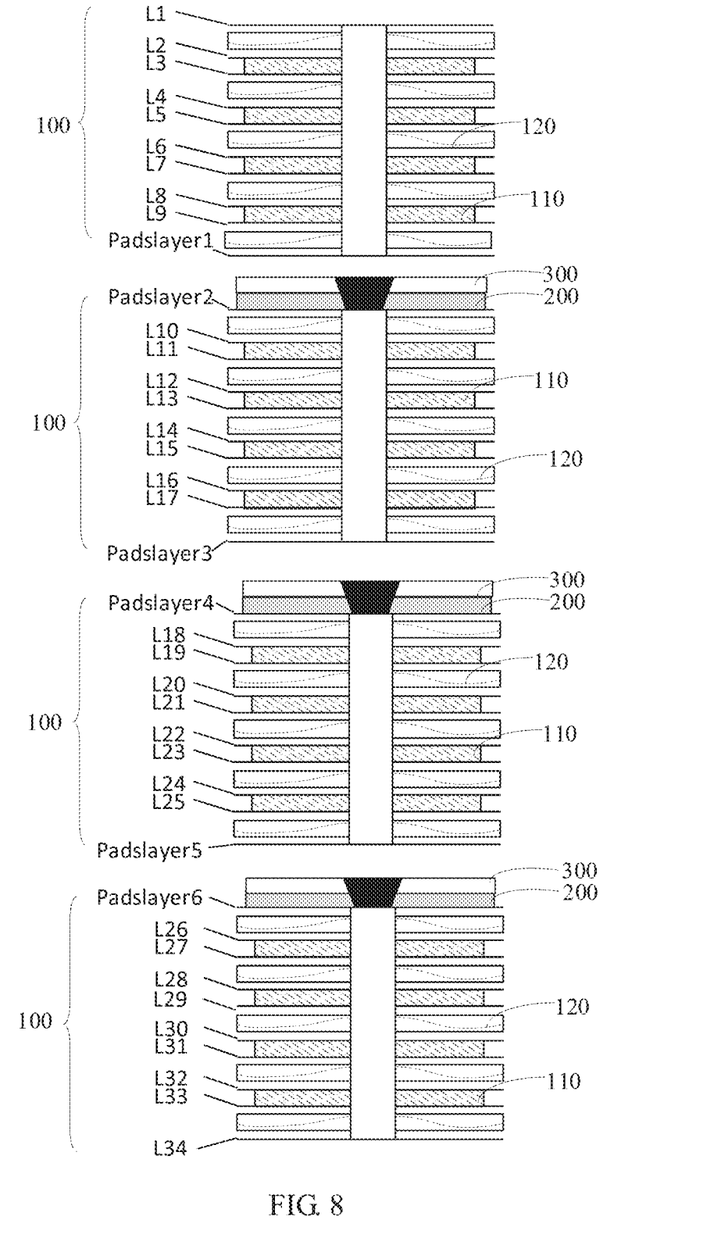
FIG. 8 is an exploded structural diagram of a circuit board according to another embodiment of the present disclosure.

Referring to FIG. 6 and FIG. 8, the at least two sub-boards 100 are sequentially arranged from top to bottom to form a sub-board group. When the number of the sub-boards 100 is two, then the sub-board group includes two end sub-boards 100 at both ends, as shown in FIG. 6. When the number of sub-boards 100 is more than two, then the sub-board group includes at least one intermediate sub-board 100 located between two end sub-boards 100 in addition to two sub-boards 100, as shown in FIG. 8. When the sub-board 100 is the end sub-board 100, the pad layer thereof is located only on one side of the sub-board 100, and the other side of the sub-board 100 is a surface circuit layer (e.g., L1, L18 shown in FIG. 6, and L1, L34 shown in FIG. 8). When the sub-board 100 is the intermediate sub-board 100, the pad layers thereof are located on upper and lower sides of the sub-board 100.

It should be noted that, in the embodiment of the present disclosure, a circuit layer may be used to replace the pad layer described above according to actual requirements.

In step S200, in two adjacent sub-boards 100, the hole connecting layer is manufactured by using the method of step S210 to step S250.

The first insulating dielectric layer 200 covers the pad layer of the sub-board 100.

In step S300, all of the sub-boards 100 are laminated to form the mother board, as shown in FIG. 6. The conductive via hole 130 on each sub-board 100 is electrically connected to the conductive via hole 130 of the adjacent another sub-board 100 through the conductive medium 400.

In the method of manufacturing the circuit board described in the embodiment of the present disclosure, the pad layer is arranged on the surface of each sub-board 100 to be bonded, and the circuit of each layer on each sub-board 100 extends to the pads on the pad layer through the conductive via hole 130, and thereafter is electrically connected to the circuit of each layer on another sub-board 100 via the conductive medium 400 on the hole connecting layer. In the process of pressing, the insulating dielectric layer 200 bonds the two adjacent upper and lower sub-boards. Since upper and lower sides of the insulating dielectric layer 200 are in contact with the pad layer of the sub-board 100, the pad layer only has pads (without circuits), and the rests of the pad layer are copper-free areas, so as to reduce the residual copper rate, and then reduce the difficulty of filling glue, strengthen the bonding strength between the sub-boards 100, and avoid the delamination phenomenon due to insufficient glue filling, which caused by the bonding between the sub-board 100 circuit layer and the insulating dielectric layer 200 directly. In addition, the present disclosure also effectively avoid that the pad is directly added in the original design circuit layer, so as to avoid a short circuit phenomenon of the circuit board caused by insufficient alignment space (the alignment space refers to a space that can be displaced between two adjacent sub-boards 100 under the condition that normal conduction is ensured) between the conductive medium 400 on one sub-board 100 and the pad on another sub-board 100 in the contacting process of the sub-boards 100. Because there is a circuit on the original design circuit layer, the sub-board 100 is easily connected with the circuit through displaced contacting, resulting in the short circuit phenomenon.

Figure 4:
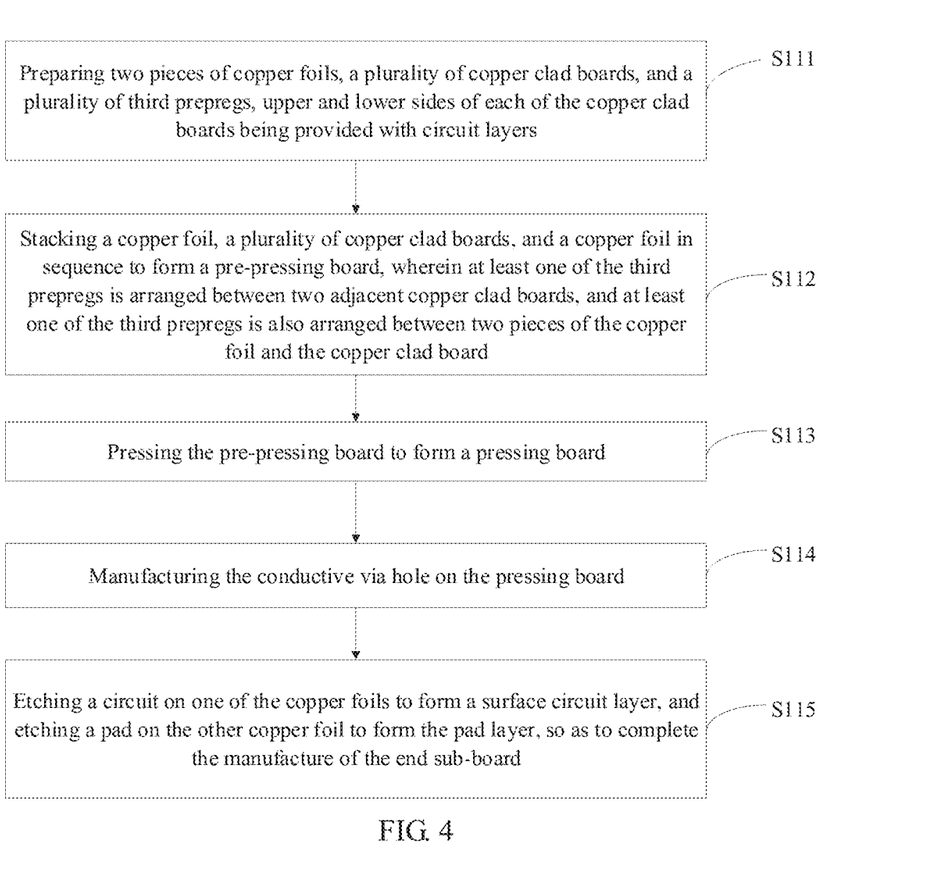
FIG. 4 is a flowchart of manufacturing an end sub-board according to an embodiment of the present disclosure.

In one of the embodiments, when the total number of all the sub-boards 100 is two, step S100 only includes step S110 of manufacturing the end sub-boards 100. As shown in FIG. 4 and FIG. 6, step S110 specifically includes the following steps:

In step S111, two pieces of copper foils, a plurality of copper clad boards 110 and a plurality of third prepregs 120 are prepared. Upper and lower sides of each of the copper clad boards 110 are provided with circuit layers, such as (L2, L3), (L4, L5), or the like shown in FIG. 6.

In step S112, a copper foil, a plurality of copper clad boards 110, and a copper foil are stacked in sequence from top to bottom to form a pre-pressing board. At least one of the third prepregs 120 is arranged between two adjacent copper clad boards 110, and at least one of the third prepregs 120 is also arranged between two pieces of copper foil and the copper clad board 110.

In step S113, the pre-pressing board is pressed to form a pressing board.

In step S114, the conductive via hole 130 is manufactured on the pressing board, which includes two process steps of drilling and plating.

In step S115, a circuit is etched on one of the copper foils to form a surface circuit layer (such as L1 or L18 shown in FIG. 6), and a pad is etched on the other copper foil to form the pad layer (such as padslayer1 or padslayer2 shown in FIG. 6), so as to complete the manufacture of the end sub-board 100. It should be noted that in the process of pressing between the respective sub-boards 100, the two end sub-boards 100 are symmetrically disposed, i.e., the pad layers on the two end sub-boards 100 are oppositely disposed.

As can be known from the above, in the embodiment of the present disclosure, the number of copper foil layers (including circuit layers (L1-L18) and the pad layers) on the end sub-board 100 is even, so as to make the lamination structure of the sub-board 100 symmetrical and avoid the occurrence of warpage.

Figure 5:
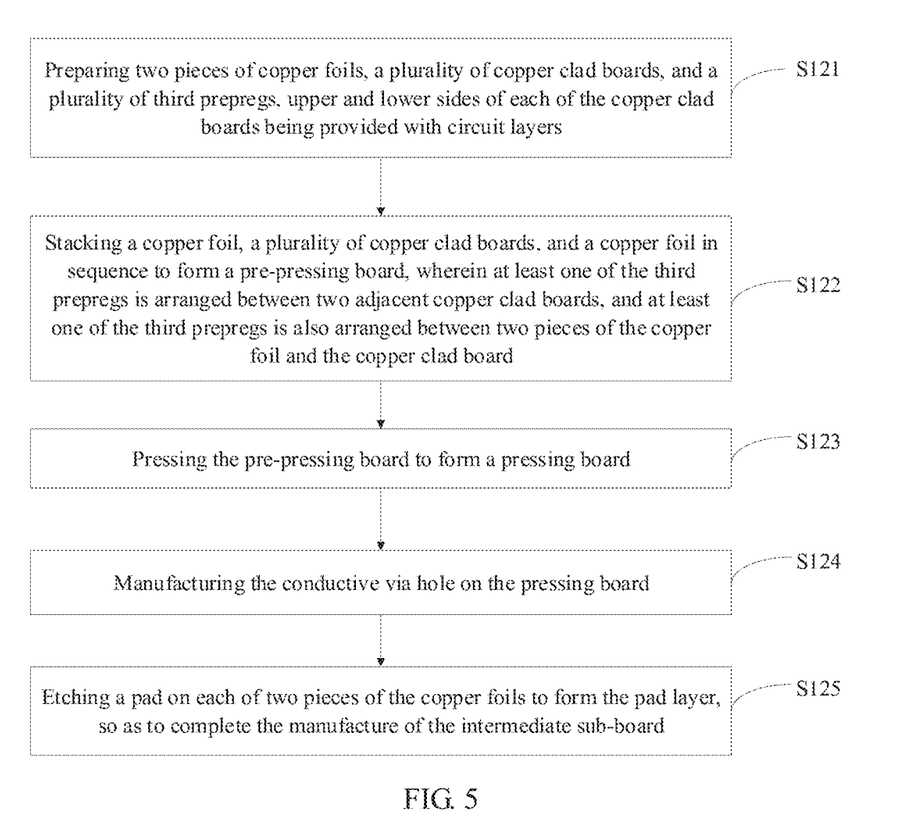
FIG. 5 is a flowchart of manufacturing an intermediate sub-board according to an embodiment of the present disclosure.

In addition, in another embodiment, when the total number of all the sub-boards 100 is more than two, then step S100 not only includes step S110, but also includes step S120 of manufacturing the intermediate sub-board 100. As shown in FIG. 5 and FIG. 8, step S120 specifically includes the following steps:

In step S121, two pieces of copper foils, a plurality of copper clad boards 110 and a plurality of third prepregs 120 are prepared. Upper and lower sides of each of the copper clad boards 110 are provided with circuit layers, such as (L10, L11), (L12, L13), or the like shown in FIG. 8.

In step S122, a copper foil, a plurality of copper clad boards 110, and a copper foil are stacked in sequence from top to bottom to form a pre-pressing board. At least one of the third prepregs 120 is arranged between two adjacent copper clad boards 110, and at least one of the third prepregs 120 is also arranged between two pieces of copper foil and the copper clad board 110.

In step S123, the pre-pressing board is pressed to form a pressing board.

In step S124, the conductive via hole 130 is manufactured on the pressing board, which includes two process steps of drilling and plating.

In step S125, a pad is etched on each of two pieces of copper foils to form the pad layer (such as padslayer2, padslayer3 or padslayer4, padslayer5 shown in FIG. 8), so as to complete the manufacture of the end sub-board 100.

Similarly, in the embodiment of the present disclosure, the number of copper foil layers (including circuit layers and the pad layers) on the intermediate sub-board 100 is also even, so as to make the lamination structure of the sub-board 100 symmetrical and avoid the occurrence of warpage. At the same time, both sides of the intermediate sub-board 100 are provided with the pad layer, so as to realize to be in contact with the sub-boards 100 on upper and lower sides of the intermediate sub-board 100.

It should be noted that, in the present disclosure, the sequence between step S110 and step S120 is not limited, and a person skilled in the art may perform arbitrary sequence or simultaneous sequence according to actual requirements.

In addition, before step S100, the method further includes a step of symmetrically splitting the object circuit board according to the drilling tape and the number of layers of the object order, so as to determine the number of the sub-boards 100. The total number of the sub-boards 100 to be pressed may be determined through this step, so that the design of the sub-board 100 is simpler and it only needs to be manufactured by symmetrically splitting according to the original design of the customer.

Figure 7:
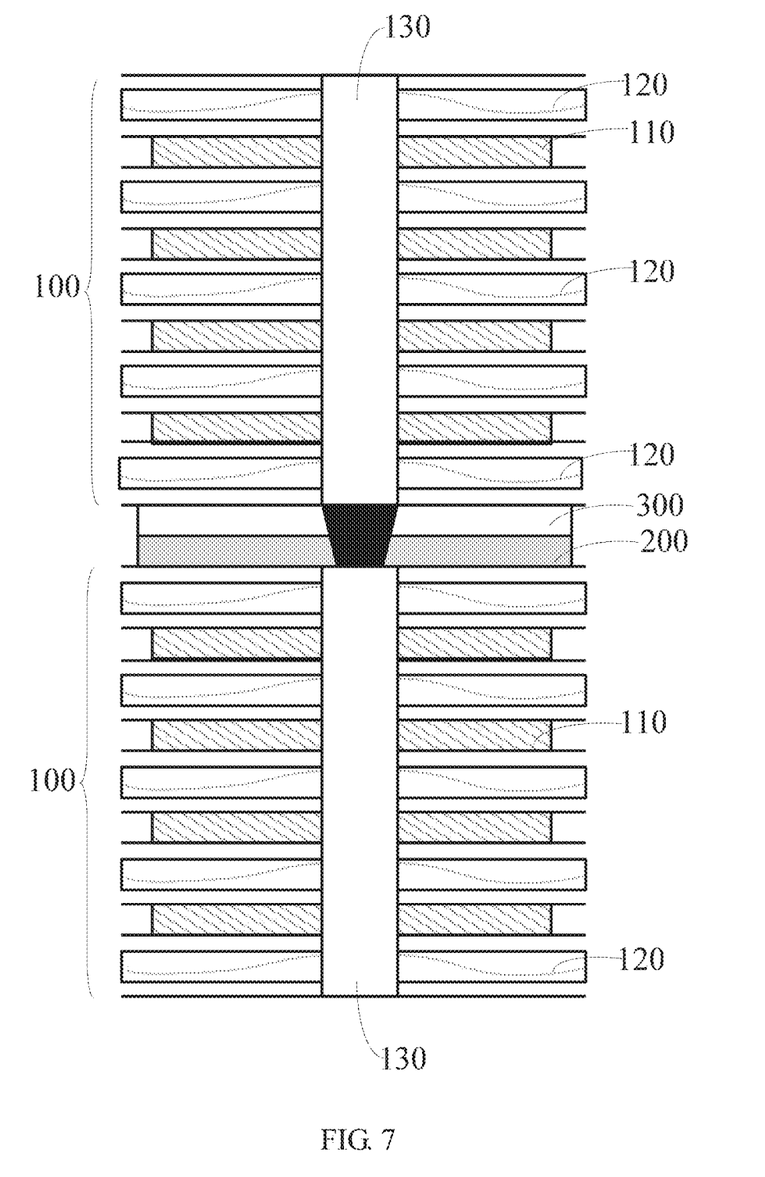
FIG. 7 is a structural diagram of a circuit board according to an embodiment of the present disclosure.

As shown in FIG. 7, in the present disclosure, a circuit board manufactured by using the manufacturing method described above is provided. The circuit board includes a hole connecting layer and at least two sub-boards 100. At least two sub-boards 100 are stacked in sequence from top to bottom, and a hole connecting layer is arranged between two adjacent sub-boards 100. The hole connecting layer includes a first insulating dielectric layer 200 pre-pressed and pre-cured on one of the sub-boards 100 and a second insulating dielectric layer 300 arranged on the first insulating dielectric layer 200. The second insulating dielectric layer 300 is used to be bonded to the adjacent another sub-board 100 in the process of pressing and shaping. The first insulating dielectric layer 200 is provided with a first receiving hole, and the second insulating dielectric layer 300 is provided with a second receiving hole. Both of the first receiving hole and the second receiving hole are provided with a conductive medium 400. One of two adjacent sub-boards 100 is electrically connected to the other sub-board 100 through the conductive medium 400.

The circuit board according to the embodiment of the present disclosure includes a new type of hole connecting layer, so that the circuit board not only can meet the requirement of filling glue on both sides and improve the adhesive strength of two adjacent sub-boards 100, but also control the fluidity of the hole connecting layer, prevent the hole shape of the receiving hole from being damaged due to too much flowing glue, and ensure that the conductive medium is not squeezed and scattered.

The technical features of the embodiments described above may be arbitrarily combined. In order to simplify the description, all possible combinations of the respective technical features in the embodiments described above are not described. However, as long as the combinations of these technical features are not contradictory, they should be considered within the scope described in this specification.

The embodiments described above represent only a few implementations of the present disclosure, and the description thereof is more specific and detailed, but it cannot therefore be understood as limiting the scope of the present disclosure patent. It should be noted that several modifications and improvements may be made to those of ordinary skill in the art without departing from the inventive concept, all of which fall within the protection scope of the present disclosure.

What is claimed is:

1. A method of manufacturing a hole connecting layer, the hole connecting layer being arranged between two adjacent sub-boards in at least two sub-boards stacked in sequence from top to bottom, the method comprising: attaching a first insulating dielectric layer for pressing and filling glue to a side of one of the sub-boards facing adjacent another sub-board; pressing and curing the first insulating dielectric layer located on the sub-board; attaching a second insulating dielectric layer for pressing and filling glue on the first insulating dielectric layer after pressing and curing, wherein a side of the second insulating dielectric layer away from the first insulating dielectric layer is configured to be bonded to the adjacent another sub-board; manufacturing a first receiving hole in the first insulating dielectric layer, and manufacturing a second receiving hole in the second insulating dielectric layer, wherein the first receiving hole and the second receiving hole are arranged oppositely up and down; and filling a conductive medium in the first receiving hole and the second receiving hole to complete the manufacture of the hole connecting layer, wherein each sub-board is electrically connected to the adjacent another sub-board through the conductive medium; wherein a diameter of the first receiving hole gradually increases, and a minimum diameter of the first receiving hole is less than a diameter of a conductive via hole of two adjacent sub-boards, a diameter of the second receiving hole gradually increases, a minimum diameter of the second receiving hole is equal to a maximum diameter of the first receiving hole, and a maximum diameter of the second receiving hole is equal to the diameter of the conductive via hole of the two adjacent sub-boards.

2. The method of manufacturing the hole connecting layer according to claim 1, wherein the conductive medium is a conductive resin.

3. The method of manufacturing the hole connecting layer according to claim 1, wherein the first insulating dielectric layer is a thermosetting first prepreg.

4. The method of manufacturing the hole connecting layer according to claim 1, wherein in the step of the attaching the second insulating dielectric layer on the first insulating dielectric layer, the second insulating dielectric layer comprises a second prepreg and a protective layer located on the second prepreg, and after the step of the manufacturing the first receiving hole in the first insulating dielectric layer, and manufacturing the second receiving hole in the second insulating dielectric layer, the method further comprises the step of removing the protective film.

5. A method of manufacturing a circuit board, the method comprising:
  manufacturing sub-boards, the number of the sub-boards being at least two, and the at least two sub-boards being arranged in sequence from top to bottom, wherein one side of each of the manufactured sub-boards facing adjacent another sub-board is provided with a pad layer, and the pad layer is provided with a pad in one-to-one correspondence and conduction with a conductive via hole on the sub-board;
  manufacturing a hole connecting layer in two adjacent sub-boards by using the method of manufacturing the hole connecting layer according to claim 1; and
  laminating all of the sub-boards to form a mother board.

6. The method of manufacturing the circuit board according to claim 5, wherein the at least two sub-boards are arranged in sequence from top to bottom to form a sub-board group, and the sub-board group comprises two end sub-boards at both ends, the step of the manufacturing sub-boards comprises a step of manufacturing the end sub-boards, the step of the manufacturing the end sub-boards comprises:
  preparing two pieces of copper foils, a plurality of copper clad boards, and a plurality of third prepregs, upper and lower sides of each of the copper clad boards being provided with circuit layers;
  stacking a copper foil, a plurality of copper clad boards, and a copper foil in sequence to form a pre-pressing board, wherein at least one of the third prepregs is arranged between two adjacent copper clad boards, and at least one of the third prepregs is also arranged between two pieces of the copper foil and the copper clad board;
  pressing the pre-pressing board to form a pressing board;
  manufacturing the conductive via hole on the pressing board; and
  etching a circuit on one of the copper foils to form a surface circuit layer, and etching a pad on the other copper foil to form the pad layer, so as to complete the manufacture of the end sub-board.

7. The method of manufacturing the circuit board according to claim 6, wherein the number of the sub-boards is at least three, the sub-board group further comprises an intermediate sub-board located between two end sub-boards, the step of the manufacturing sub-boards further comprises a step of manufacturing the intermediate sub-board, the step of the manufacturing the intermediate sub-board comprises:
  preparing two pieces of copper foils, a plurality of copper clad boards, and a plurality of third prepregs, upper and lower sides of each of the copper clad boards being provided with circuit layers;
  stacking a copper foil, a plurality of copper clad boards, and a copper foil in sequence to form a pre-pressing board, wherein at least one of the third prepregs is arranged between two adjacent copper clad boards, and at least one of the third prepregs is also arranged between two pieces of the copper foil and the copper clad board;
  pressing the pre-pressing board to form a pressing board;
  manufacturing the conductive via hole on the pressing board; and
  etching a pad on each of two pieces of the copper foils to form the pad layer, so as to complete the manufacture of the intermediate sub-board.

8. A circuit board, comprising: a hole connecting layer; and at least two sub-boards, wherein the at least two sub-boards are stacked in sequence from top to bottom; wherein the hole connecting layer is arranged between two adjacent sub-boards, the hole connecting layer comprising: a first insulating dielectric layer pre-pressed and pre-cured on one of the sub-boards; and a second insulating dielectric layer arranged on the first insulating dielectric layer; wherein the second insulating dielectric layer is configured to be bonded to adjacent another sub-board in a process of pressing and shaping, the first insulating dielectric layer being provided with a first receiving hole, the second insulating dielectric layer being provided with a second receiving hole, both of the first receiving hole and the second receiving hole being provided with a conductive medium, wherein one of two adjacent sub-boards is electrically connected to the other sub-board through the conductive medium; wherein a diameter of the first receiving hole gradually increases, and a minimum diameter of the first receiving hole is less than a diameter of a conductive via hole of two adjacent sub-boards, a diameter of the second receiving hole gradually increases, a minimum diameter of the second receiving hole is equal to a maximum diameter of the first receiving hole, and a maximum diameter of the second receiving hole is equal to the diameter of the conductive via hole of the two adjacent sub-boards.

\* \* \* \* \*